(12) United States Patent
Ito et al.

(10) Patent No.: US 12,154,915 B2
(45) Date of Patent: Nov. 26, 2024

(54) DISPLAY DEVICE

(71) Applicant: SHARP KABUSHIKI KAISHA, Sakai (JP)

(72) Inventors: Kazuatsu Ito, Sakai (JP); Hirohide Mimura, Sakai (JP); Masahito Sano, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 686 days.

(21) Appl. No.: 17/603,733

(22) PCT Filed: Apr. 17, 2019

(86) PCT No.: PCT/JP2019/016522
§ 371 (c)(1),
(2) Date: Oct. 14, 2021

(87) PCT Pub. No.: WO2020/213102
PCT Pub. Date: Oct. 22, 2020

(65) Prior Publication Data
US 2022/0199657 A1 Jun. 23, 2022

(51) Int. Cl.
*H01L 27/12* (2006.01)
*H10K 59/131* (2023.01)
*H10K 71/00* (2023.01)

(52) U.S. Cl.
CPC ...... *H01L 27/1262* (2013.01); *H01L 27/1225* (2013.01); *H01L 27/124* (2013.01);
(Continued)

(58) Field of Classification Search
CPC ............. H01L 27/1262; H01L 27/1225; H01L 27/124; H10K 59/131
See application file for complete search history.

(56) References Cited

U.S. PATENT DOCUMENTS 7,319,239 B2 * 1/2008 Tsubata ............. G02F 1/136227
257/E21.414
10,879,329 B2 * 12/2020 Kuniyoshi ......... H10K 59/1213
(Continued)

FOREIGN PATENT DOCUMENTS

JP 2018-195747 A 12/2018

*Primary Examiner* — Dale E Page
*Assistant Examiner* — Abbigale A Boyle
(74) *Attorney, Agent, or Firm* — ScienBiziP, P.C.

(57) ABSTRACT

A display device includes: a first gate insulating film; a first interlayer insulating film; a lower metal layer; an oxide semiconductor layer; a second gate insulating film; a second gate electrode; a second interlayer insulating film; and an upper metal layer being sequentially provided on a substrate, wherein the oxide semiconductor layer includes a second channel region and a second conductor region, the second gate insulating film is disposed in alignment with the second gate electrode, a first contact hole is provided in the first gate insulating film and the first interlayer insulating film, the lower metal layer includes a second conductor connection wiring line, a protection layer having an island shape is provided between the second conductor region and the second interlayer insulating film, a second contact hole exposing the second conductor connection wiring line is provided in the protection layer and the second interlayer insulating film.

20 Claims, 11 Drawing Sheets

(52) U.S. Cl.
CPC ....... *H01L 27/1248* (2013.01); *H10K 59/131* (2023.02); *H10K 59/1315* (2023.02); *H10K 71/00* (2023.02)

(56) References Cited

U.S. PATENT DOCUMENTS

| | | | |
|---|---|---|---|
| 2015/0187814 A1* | 7/2015 | Miyairi | H01L 29/78603 |
| | | | 257/43 |
| 2015/0255490 A1* | 9/2015 | Miyairi | H01L 29/7869 |
| | | | 257/43 |
| 2016/0336386 A1* | 11/2016 | Saito | H01L 27/1225 |
| 2017/0278916 A1* | 9/2017 | Maruyama | H01L 27/1225 |
| 2018/0158844 A1* | 6/2018 | Choi | H01L 27/124 |
| 2022/0190000 A1* | 6/2022 | Ishida | H01L 27/127 |

* cited by examiner

DISPLAY DEVICE

TECHNICAL FIELD

The disclosure relates to a display device.

BACKGROUND ART

PTL 1 discloses a semiconductor circuit provided with a transistor including a silicon semiconductor layer and a transistor including an oxide semiconductor layer formed on the same substrate.

CITATION LIST

Patent Literature

PTL 1: JP 2018-195747 A

SUMMARY

Technical Problem

In a substrate having a hybrid structure in which for example, a top gate type first transistor including low-temperature polysilicon (LTPS) as a crystalline silicon semiconductor layer and, for example, a top gate type second transistor including InGaZnOx as an oxide semiconductor layer are formed on the same substrate, after a first contact hole electrically connecting the crystalline silicon semiconductor layer and an upper wiring line (upper metal layer) is formed, a hydrofluoric acid (HF) treatment step is performed in which a surface oxide film of the crystalline silicon semiconductor layer is removed in order to reduce a contact resistance between the crystalline silicon semiconductor layer and the wiring line. Thereafter, the upper wiring line is formed. Then, in the substrate having a hybrid structure, the first contact hole and a second contact hole electrically connecting a lower wiring line (lower metal layer) below the upper wiring line and the upper wiring line are formed simultaneously, and thus, by the hydrofluoric acid (HF) treatment step, the oxide semiconductor layer exposed from the second contact hole is also simultaneously etched, whereby a problem occurs in which the second contact hole is damaged.

(a) of FIG. 11 to (c) of FIG. 11 are diagrams for explaining a problem of damage due to HF in a second contact hole 102C in a substrate of a known hybrid structure.

(a) of FIG. 11 is a diagram illustrating a state before the second contact hole 102C is formed, and a lower wiring line 100 is formed of Mo and covered with an oxide semiconductor layer 101. The oxide semiconductor layer 101 is formed of, for example, InGaZnOx. An insulating film 102 is formed of a silicon nitride (SiNx) film.

(b) of FIG. 11 is a diagram illustrating a state in which the second contact hole 102C is formed in the insulating film 102, and the oxide semiconductor layer 101 is exposed from the second contact hole 102C. After this, the hydrofluoric acid (HF) treatment is performed to remove a surface oxide film of a crystalline silicon semiconductor layer (not illustrated); however, as illustrated in (c) of FIG. 11, at this time, hydrofluoric acid (HF) permeates from a region shifted by the oxide semiconductor layer 101 being etched to damage the insulating film 102 thereabove, so that the insulating film 102 is made to have an undercut shape (reverse tapered shape) in the second contact hole 102C. As a result, there has occurred a problem in that a step disconnection easily occurs in an upper wiring line (not illustrated) electrically connected to the lower wiring line 100 to increase a contact resistance and a contact area.

Solution to Problem

In order to solve the above problem, a display device according to an embodiment of the disclosure is a display device including: a crystalline silicon semiconductor layer; a first gate insulating film; a first gate electrode; a first interlayer insulating film; a lower metal layer; an oxide semiconductor layer; a second gate insulating film; a second gate electrode; a second interlayer insulating film; and an upper metal layer, the crystalline silicon semiconductor layer, the first gate insulating film, the first gate electrode, the first interlayer insulating film, the lower metal layer, the oxide semiconductor layer, the second gate insulating film, the second gate electrode, the second interlayer insulating film, and the upper metal layer being sequentially provided on a substrate, wherein the substrate is provided with a first transistor including the crystalline silicon semiconductor layer and a second transistor including the oxide semiconductor layer,
the crystalline silicon semiconductor layer includes a first channel region and a first conductor region,
the oxide semiconductor layer includes a second channel region and a second conductor region,
the second gate insulating film is disposed in alignment with the second gate electrode,
a first contact hole exposing the first conductor region and electrically connecting the first conductor region and the second conductor region is provided in the first gate insulating film and the first interlayer insulating film,
the lower metal layer includes a second conductor connection wiring line in contact with the second conductor region,
the upper metal layer includes an upper layer connection wiring line,
a protection layer having an island shape is provided between the second conductor region and the second interlayer insulating film,
a second contact hole exposing the second conductor connection wiring line is provided in the protection layer and the second interlayer insulating film,
the upper layer connection wiring line is in contact with the second conductor connection wiring line in the second contact hole, and
the second conductor region and the upper layer connection wiring line are electrically connected to each other via the second conductor connection wiring line.

Advantageous Effects of Disclosure

According to an aspect of the disclosure, it is possible to provide a display device in which increase in contact resistance and enlargement of a contact area can be suppressed.

DESCRIPTION OF EMBODIMENTS

Figure 1:
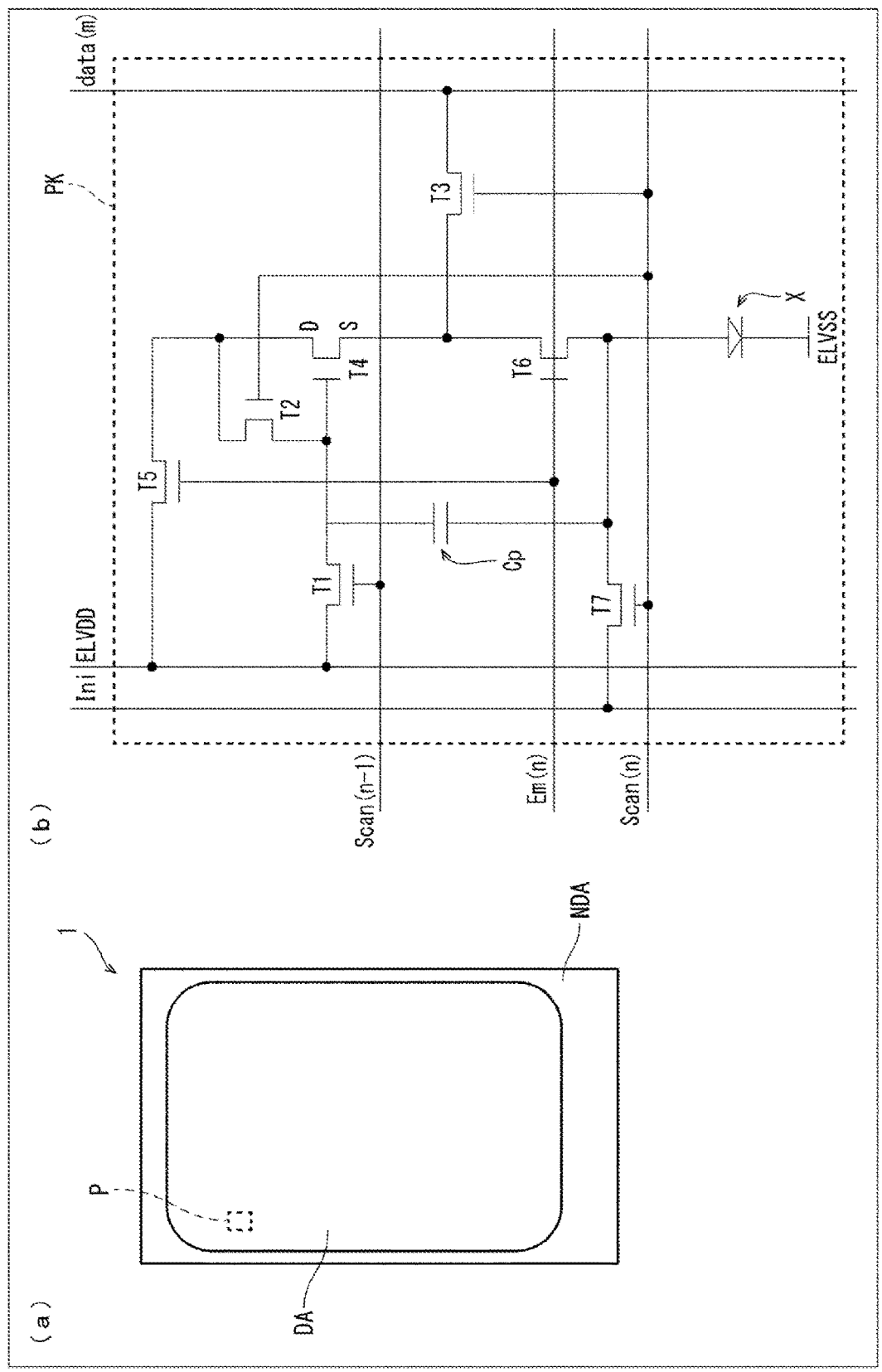
FIG. 1(a) is a schematic plan view illustrating a configuration of a display device according to a present embodiment.
FIG. 1(b) is a circuit diagram illustrating an example of a pixel circuit of the display device according to the present embodiment.

A description follows regarding embodiments of the disclosure, with reference to FIG. 1 to FIG. 10. Hereinafter, for convenience of description, components having the same functions as those described in a specific embodiment are denoted by the same reference numerals, and descriptions thereof may be omitted.

(a) of FIG. 1 is a schematic plan view illustrating a configuration of a display device 1 according to a present embodiment, and (b) of FIG. 1 is a circuit diagram illustrating an example of a pixel circuit of the display device 1 according to the present embodiment.

Figure 2:
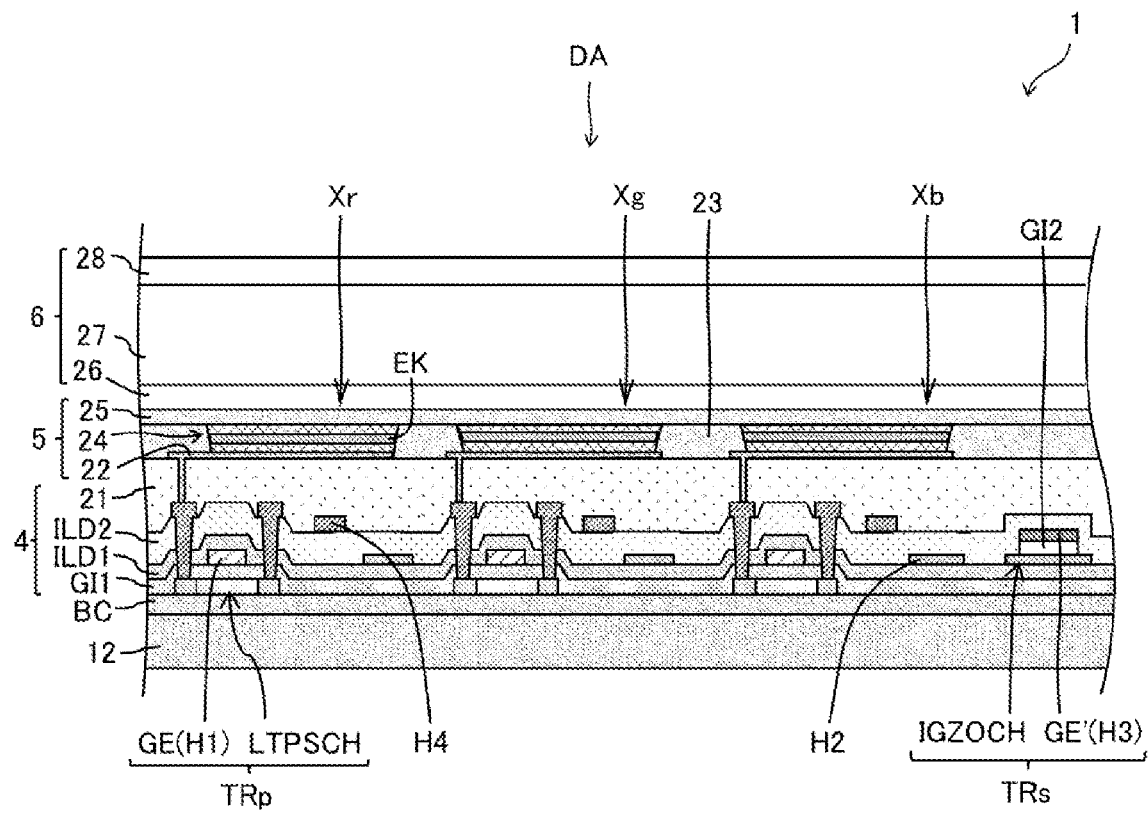
FIG. 2 is a cross-sectional view illustrating the configuration of the display device according to the present embodiment.

FIG. 2 is a cross-sectional view illustrating a configuration of the display device 1 according to the present embodiment.

As illustrated in FIG. 2, in the display device 1, a barrier layer BC, a TFT layer 4, a light-emitting element layer 5 of a top emission (emitting light to an upper layer side) type, and a sealing layer 6 are formed in this order on a substrate 12, and a plurality of subpixels each including a self-luminous element X are formed in a display region DA.

The substrate 12 is a glass substrate or a flexible base material including a resin such as polyimide as a main component, and for example, the substrate 12 may be constituted by two polyimide films and an inorganic film sandwiched therebetween. The barrier layer (base coat layer) BC is an inorganic insulating layer that prevents penetration of foreign substances such as water or oxygen, and can be composed using, for example, silicon nitride, silicon oxide, or the like.

The TFT (thin film transistor) layer 4 includes: a crystalline silicon semiconductor layer including a first channel region LTPSCH above the barrier layer BC; a first gate insulating film GI1 above the crystalline silicon semiconductor layer; a first metal layer H1 including a gate electrode GE above the first gate insulating film GI1; a first interlayer insulating film ILD1 above the first metal layer H1 including the gate electrode GE; a second metal layer (lower metal layer) H2 above the first interlayer insulating film ILD1; an oxide semiconductor layer including a second channel region IGZOCH above the second metal layer H2; a second gate insulating film GI2 above the oxide semiconductor layer; a third metal layer H3 including a gate electrode GE' above the second gate insulating film GI2; a second interlayer insulating film ILD2 above the third metal layer H3; a fourth metal layer (upper metal layer) H4 above the second interlayer insulating film ILD2; and a flattening film 21 above the fourth metal layer H4.

The crystalline silicon semiconductor layer including the first channel region LTPSCH is composed of low-temperature polysilicon (LTPS), for example. The oxide semiconductor layer including the second channel region IGZOCH includes at least one element selected from indium (In), gallium (Ga), tin (Sn), hafnium (Hf), zirconium (Zr), and zinc (Zn), and oxygen. Specifically, an oxide semiconductor (InGaZnO) including indium (In), gallium (Ga), zinc (Zn), and oxygen, an oxide semiconductor (InSnZnO) including indium (In), tin (Sn), zinc (Zn), and oxygen, an oxide semiconductor (InZrZnO) including indium (In), zirconium (Zr), zinc (Zn), and oxygen (InZrZnO), an oxide semiconductor (InHfZnO) including indium (In), hafnium (Hf), zinc (Zn), and oxygen, or the like can be used.

In FIG. 2, a first transistor TRp is configured to include the crystalline silicon semiconductor layer including the gate electrode GE and the first channel region LTPSCH, and a second transistor TRs is configured to include the oxide semiconductor layer including the gate electrode GE' and the second channel region IGZOCH.

The first metal layer H1, the second metal layer H2, the third metal layer H3, and the fourth metal layer H4 are each formed of a single layer film or a layered film of metal, the metal including at least one of aluminum, tungsten, molybdenum, tantalum, chromium, titanium, and copper, for example.

The first gate insulating film GI1, the first interlayer insulating film ILD1, the second gate insulating film GI2, and the second interlayer insulating film ILD2 can be formed of a silicon oxide (SiOx) film, a silicon nitride (SiNx) film, or a layered film of these, formed using a CVD method. Preferably, a silicon oxide (SiOx) film can be used as the first gate insulating film GI1, a layered film in which a lower layer is a silicon nitride (SiNx) film and an upper layer is a silicon oxide (SiOx) film can be used as the first interlayer insulating film ILD1, a silicon oxide (SiOx) film can be used as the second gate insulating film GI2, and a layered film in which a lower layer is a silicon nitride (SiNx) film and an upper layer is a silicon oxide (SiOx) film can be used as the second interlayer insulating film ILD2. The silicon oxide (SiOx) film can be formed using tetraethyl orthosilicate (TEOS) as a source gas by, for example, a plasma CVD method. Note that the materials of the first gate insulating film GI1, the first interlayer insulating film ILD1, the second gate insulating film GI2, and the second interlayer insulating film ILD2 described above are only examples, and thus this is not a limitation.

The flattening film 21 can be formed of, for example, a coatable organic material such as polyimide or acrylic resin.

The light-emitting element layer 5 includes a first electrode (lower electrode) 22 in an upper layer overlying the flattening film 21, an edge cover film 23 having insulating properties and covering an edge of the first electrode 22, an electroluminescent (EL) layer 24 in an upper layer overlying the edge cover film 23, and a second electrode 25 (upper electrode) in an upper layer overlying the EL layer 24. The edge cover film 23 is formed by applying an organic material such as polyimide or an acrylic resin and then patterning the organic material by photolithography, for example.

As illustrated in FIG. 2, for example, in the light-emitting element layer 5, a light-emitting element Xr (red), a light-emitting element Xg (green), and a light-emitting element Xb (blue) are formed, and each of the light-emitting elements includes the first electrode 22, the EL layer 24 (including a light-emitting layer EK), and the second electrode 25, the first electrode 22, the EL layer 24, and the second electrode 25 having an island shape. The second electrode 25 is a common electrode having a solid-like shape and common with a plurality of light-emitting elements.

The light-emitting elements Xr, Xg, Xb each may be, for example, an organic light-emitting diode (OLED) including an organic layer as the light-emitting layer, or may be a quantum dot light-emitting diode (QLED) including a quantum dot layer as the light-emitting layer.

For example, the EL layer 24 is formed by layering a hole injection layer, a hole transport layer, the light-emitting layer EK, an electron transport layer, and an electron injection layer in this order, from the lower layer side. The light-emitting layer is formed into an island shape at an opening of the edge cover film 23 (on a subpixel-by-subpixel basis) by a vapor deposition method, an ink-jet method, or a lithography method. Other layers are formed in an island shape or a solid-like shape (common layer). A configuration can also be adopted in which one or more layers are not formed among the hole injection layer, the hole transport layer, the electron transport layer, and the electron injection layer.

The first electrode 22 (anode) is a light reflective electrode formed by layering, for example, indium tin oxide (ITO) and silver (Ag) or an alloy including Ag. The second electrode 25 (cathode) is formed of a metal thin film of, for example, a magnesium silver alloy and has light transmittance.

In a case where the light-emitting elements Xr, Xg, Xb each are an OLED, holes and electrons recombine in the light-emitting layer EK in response to a drive current between the first electrode 22 and the second electrode 25, and light is emitted when excitons generated in this manner transition to a ground state. In a case where the light-emitting elements Xr, Xg, Xb each are a QLED, holes and electrons recombine in the light-emitting layer EK in response to a drive current between the first electrode 22 and the second electrode 25, and light is emitted when excitons generated in this manner transition from a conduction band of a quantum dot to a valence band.

In FIG. 2, the sealing layer 6 covering the light-emitting element layer 5 is a layer that prevents penetration of foreign substances such as water or oxygen into the light-emitting element layer 5, and for example, the sealing layer 6 can include two inorganic sealing films 26, 28 and an organic film 27 formed therebetween.

As illustrated in (a) of FIG. 1, the display device 1 according to the present embodiment includes a display region DA including a plurality of subpixels P, and a frame region NDA surrounding the display region DA, and the frame region NDA is provided with a terminal portion.

(b) of FIG. 1 is a circuit diagram illustrating an example of a pixel circuit. In the display region DA illustrated in (a) of FIG. 1, for each of the subpixels P, a light-emitting element X and its pixel circuit PK are provided, and the pixel circuit PK and wiring lines connected thereto are formed in the TFT layer 4. Note that the pixel circuit PK illustrated in (b) of FIG. 1 illustrates the pixel circuit PK of the (n,m)th subpixel, but also includes a part of a pixel circuit of the (n−1,m)th subpixel.

The pixel circuit PK illustrated in (b) of FIG. 1 includes: a capacitance element Cp; a first initialization transistor T1 connected between a high power supply voltage line ELVDD (in the present embodiment, the high power supply voltage line ELVDD also serves as a first initialization power source line, but the high power supply voltage line ELVDD and the first initialization power source line may be provided separately) and a control terminal of a drive transistor T4 and having a gate terminal connected to a scanning signal line Scan(n−1) of a preceding stage ((n−1)th stage); a threshold control transistor T2 connected between a drain region D and the control terminal of the drive transistor T4 and having a gate terminal connected to a scanning signal line Scan(n) of an own stage (nth stage); a writing control transistor T3 connected between a data signal line data(m) and a source region S of the drive transistor T4 and having a gate terminal connected to the scanning signal line Scan(n) of the own stage (nth stage); the drive transistor T4 configured to control a current of the light-emitting element X; a power supply transistor T5 connected between the high power supply voltage line ELVDD and the drain region D of the drive transistor T4 and having a gate terminal connected to a light emission control line Em(n) stage; a light emission control transistor T6 connected between the source region S of the drive transistor T4 and the first electrode of the light-emitting element X and having a gate terminal connected to the light emission control line Em(n) stage; and a second initialization transistor T7 connected between a second initialization power source line Ini and the first electrode of the light-emitting element X and having a gate terminal connected to the scanning signal line Scan(n) of the own stage (nth stage). Note that in the present embodiment, a voltage identical to a low power supply voltage line ELVSS may be input to the second initialization power source line Ini, but this is not a limitation, and a different voltage, with which the light-emitting element X is turned off, may be input. In the present embodiment, as described in the pixel circuit PK of (b) of FIG. 1, the transistors T1 to T7 are described using, for example, a n-channel transistor as an example, but this is not a limitation, and in a case where another pixel circuit different from the pixel circuit PK of (b) of FIG. 1 is used, all the transistors T1 to T7 may be p-channel transistors, or some of them may be p-channel transistors. The capacitance element Cp is connected to the control terminal of the drive transistor T4, and holds a data signal in the data signal line data(m). Note that the second initialization transistor T7 may be connected to the scanning signal line Scan(n−1) of the preceding stage ((n−1)th stage).

The drive transistor T4 may be the first transistor TRp including the crystalline silicon semiconductor layer.

In the present embodiment, description is given using, as an example, a case in which the first initialization transistor T1, the threshold control transistor T2, and the second initialization transistor T7 are the second transistors TRs including the oxide semiconductor layer, but at least one of the first initialization transistor T1, the threshold control transistor T2, and the second initialization transistor T7 may be the second transistor TRs including the oxide semiconductor layer.

In addition, in the present embodiment, description is given using, as an example, a case in which the threshold control transistor T2 is composed of the second transistor TRs including the oxide semiconductor layer, the writing control transistor T3 is composed of the first transistor TRp including the crystalline silicon semiconductor layer, and the first gate electrode of the writing control transistor T3 and the second gate electrode of the threshold control transistor T2 are the scanning signal line Scan(n) to which a common scanning signal is input, but this is not a limitation.

Furthermore, in the present embodiment, description is given using, as an example, a case in which the power supply transistor T5 and the light emission control transistor T6 each are composed of the first transistor TRp including the crystalline silicon semiconductor layer and the first gate electrode of each of the power supply transistor T5 and the light emission control transistor T6 is the light emission control line Em(n) to which a common light emission control signal is input, but this is not a limitation.

In the present embodiment, description is given using, as an example, a case in which the display device 1 includes the pixel circuit PK illustrated in (b) of FIG. 1, but this is not a limitation, and the display device 1 may include another pixel circuit. The scanning signal line Scan(n) and the light emission control line Em(n) may be formed of either the first metal layer H1 or the third metal layer H3. For example, in a case in which the scanning signal line Scan(n) is formed of the first metal layer H1 and the light emission control line Em(n) is formed of the third metal layer H3, the first metal layer H1 and the third metal layer H3 may be layered to overlap with each other in a top plan view. The high power supply voltage line ELVDD, the first initialization power source line, the low power supply voltage line ELVSS, and the second initialization power source line Ini may be formed of any of the first metal layer H1, the second metal layer H2, the third metal layer H3, and the fourth metal layer H4, and may be provided in such a manner that a plurality of wiring lines of the third metal layer H3 and the fourth metal layer H4 are used to intersect with each other, for example. The data signal line data(m) only needs to be provided in a direction intersecting the scanning signal line Scan(n) and the light emission control line Em(n), and may be formed of any of the second metal layer H2 and the fourth metal layer H4.

Figure 3:
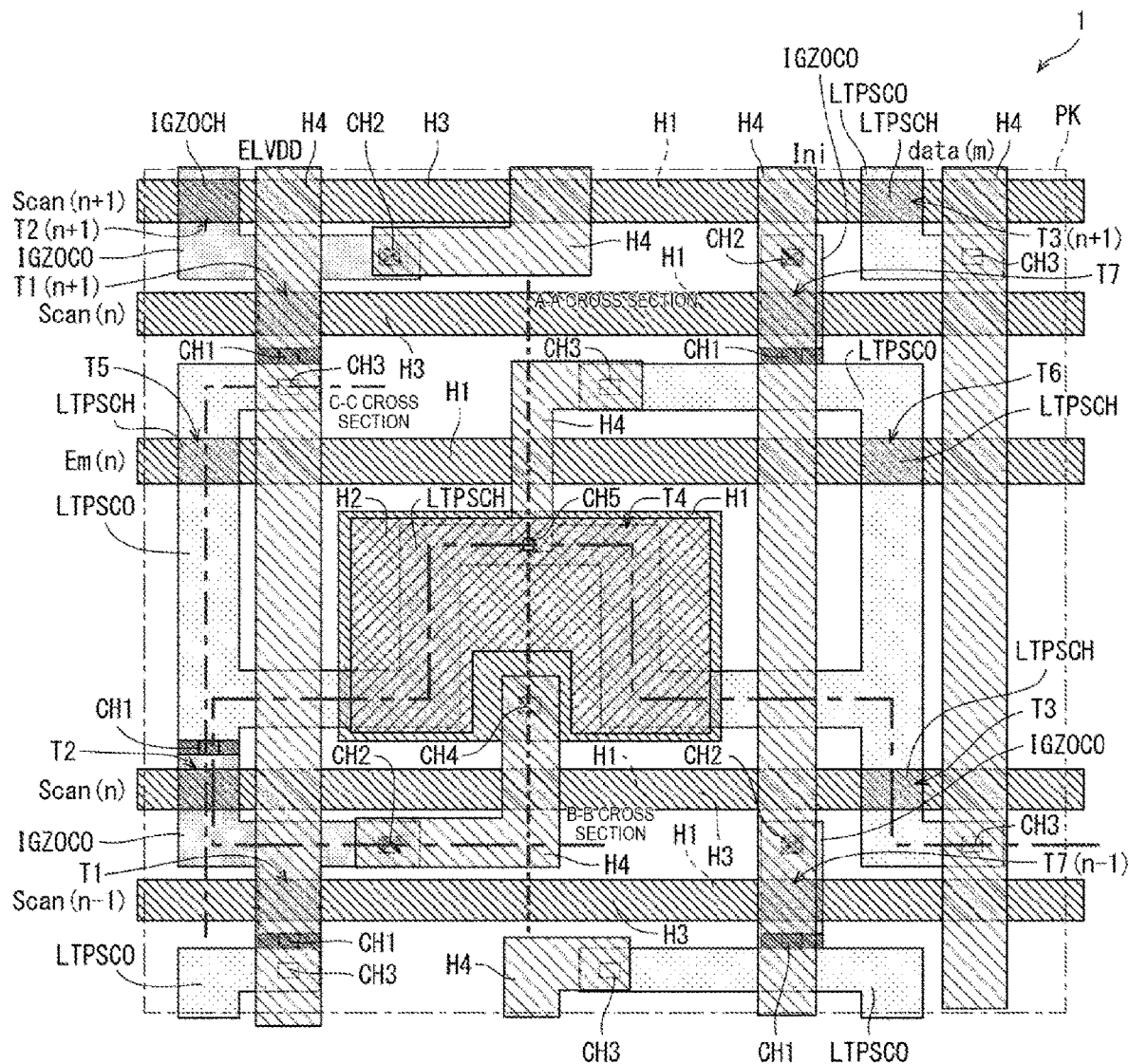
FIG. 3 is a plan view illustrating a configuration example of the pixel circuit of the display device of the present embodiment.
Figure 4:
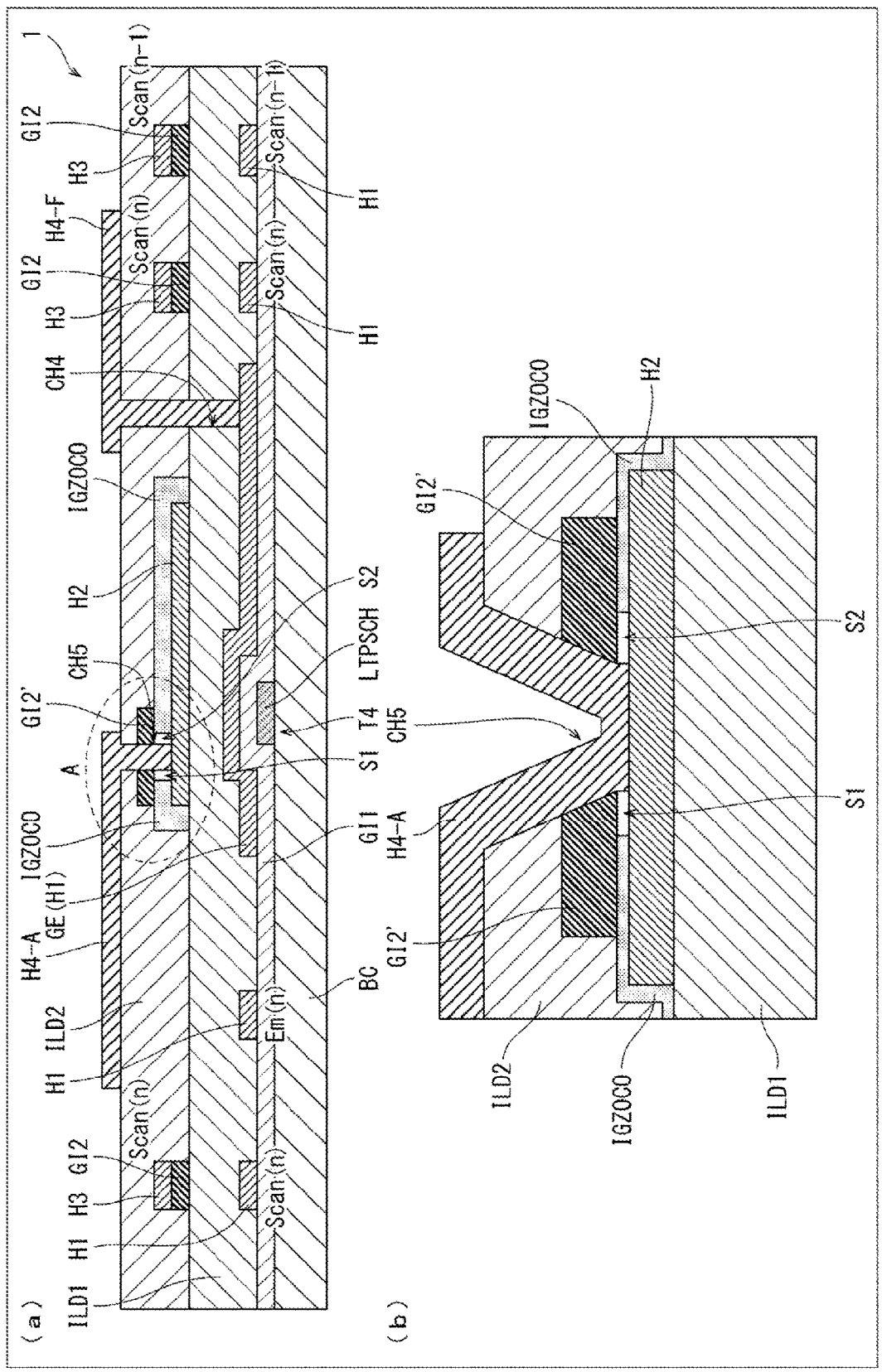
FIG. 4(a) is a diagram illustrating a cross section taken along line A-A in FIG. 3.
FIG. 4(b) is a partially enlarged view of a portion A in (a) of FIG. 4.
Figure 5:
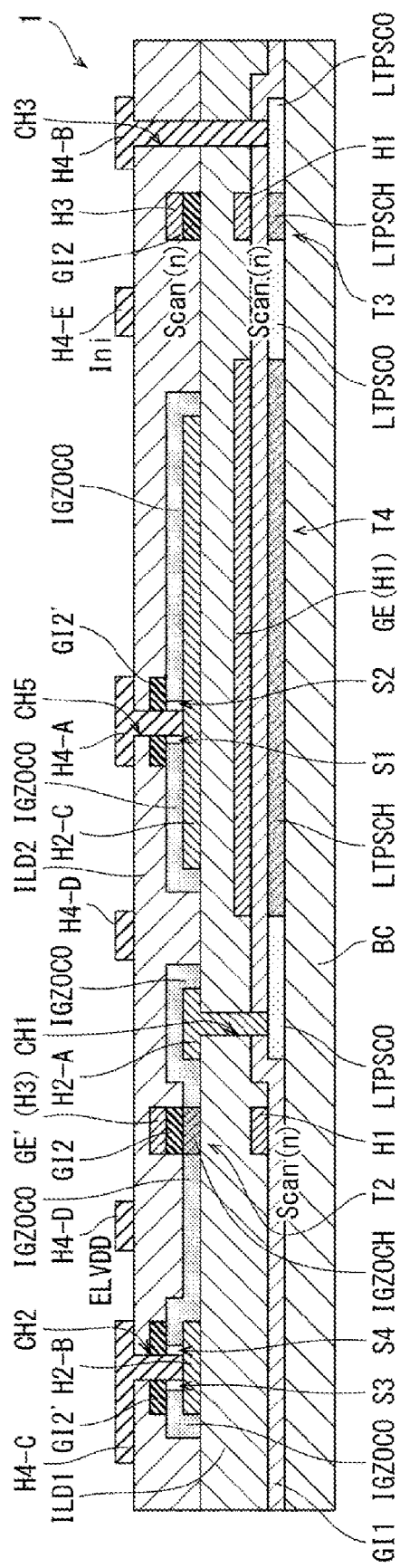
FIG. 5 is a diagram illustrating a cross section taken along line B-B in FIG. 3.
Figure 6:
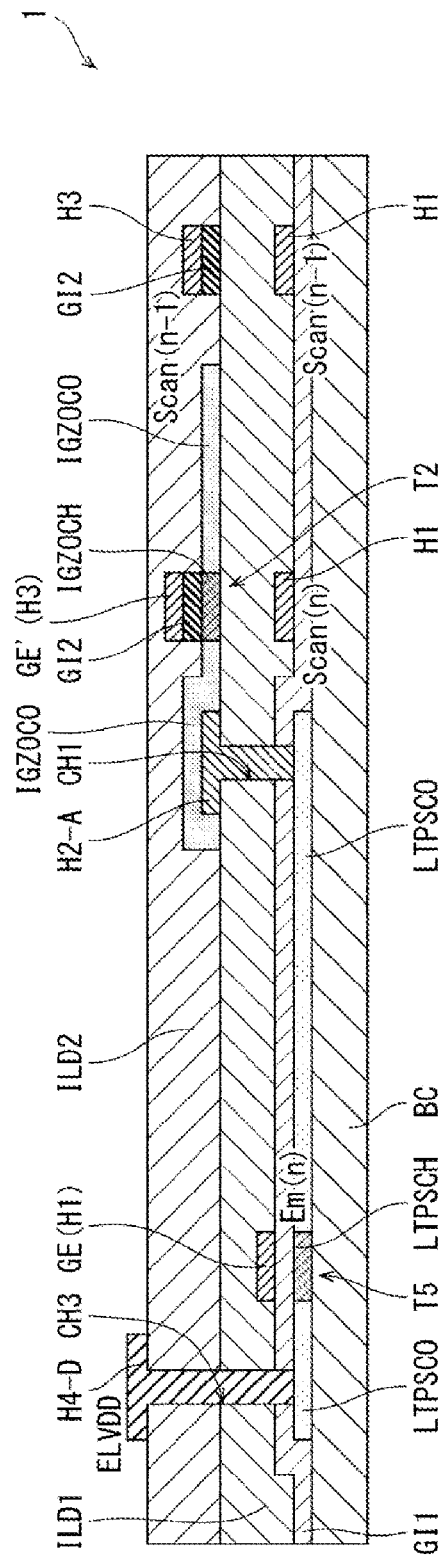
FIG. 6 is a diagram illustrating a cross section taken along line C-C in FIG. 3.

FIG. 3 is a plan view illustrating a configuration example of the pixel circuit PK of the display device 1 according to the present embodiment, (a) of FIG. 4 is a diagram illustrating a cross section taken along line A-A in FIG. 3, and (b) of FIG. 4 is a partially enlarged view of a portion A in (a) of FIG. 4. FIG. 5 is a diagram illustrating a cross section taken along line B-B in FIG. 3, and FIG. 6 is a diagram illustrating a cross section taken along line C-C in FIG. 3.

The pixel circuit illustrated in FIG. 3 illustrates the pixel circuit PK of the (n,m)th subpixel, but also includes parts of pixel circuits of the (n−1,m)th subpixel and the (n+1,m)th subpixel. For example, a second initialization transistor T7 (n−1) is included in the pixel circuit of the (n−1,m)th subpixel, and a first initialization transistor T1 (n+1), a threshold control transistor T2 (n+1), and a writing control transistor T3 (n+1) are included in the pixel circuit of the (n+1,m)th subpixel.

In the present embodiment, the second initialization transistor T7 in the pixel circuit in question (pixel circuit PK of the (n,m)th subpixel) and the second initialization transistor T7 (n−1) in the pixel circuit of the preceding stage of the pixel circuit in question (pixel circuit of the (n−1,m)th subpixel) illustrated in FIG. 3 each are composed of the second transistor TRs including the oxide semiconductor layer, the second gate electrode of the second initialization transistor T7 is the scanning signal line Scan(n) to which a scanning signal is input, the second gate electrode of the second initialization transistor T7 (n−1) is the scanning signal line Scan(n−1) to which a scanning signal is input, and the scanning signal line Scan(n) and the scanning signal line Scan(n−1) are scanning signal lines to which a common scanning signal is input.

As illustrated in FIG. 3 to FIG. 6, in the display device 1, the crystalline silicon semiconductor layer including the first channel region LTPSCH and a first conductor region LTPSCO, a first gate insulating film GI1, a first gate electrode GE (first metal layer H1), the first interlayer insulating film ILD1, the lower metal layer (second metal layer H2), the oxide semiconductor layer including the second channel region IGZOCH and a second conductor region IGZOCO, the second gate insulating film GI2, a second gate electrode GE' (third metal layer H3), the second interlayer insulating film ILD2, and the upper metal layer (fourth metal layer H4) are sequentially formed on the substrate 12 (see FIG. 2).

In the present embodiment, description is given using, as an example, a case in which in the pixel circuit PK provided in the display device 1, the first initialization transistor T1, the threshold control transistor T2, and the second initialization transistor T7 each are the second transistor TRs including the oxide semiconductor layer and the writing control transistor T3, the drive transistor T4, the power supply transistor T5, and the light emission control transistor T6 each are the first transistor TRp including the crystalline silicon semiconductor layer, but this is not a limitation.

Note that the first conductor region LTPSCO of the crystalline silicon semiconductor layer includes a source region and a drain region, and the second conductor region IGZOCO of the oxide semiconductor layer also includes a source region and a drain region.

As illustrated in FIG. 6, in the threshold control transistor T2, the second gate insulating film GI2 is provided to come into alignment with the second gate electrode GE'. Here, "coming into alignment with" also includes a case of patterning with different mask patterns, and includes, for example, a case in which an end portion of the second gate electrode GE' and an end portion of the second gate insulating film GI2 are provided to be aligned and a case in which a deviation of approximately 1 to 3 μm due to pattern shifting or a difference of etching rate occurs.

As illustrated in FIG. 6, a first contact hole CH1 that exposes the first conductor region LTPSCO of the crystalline silicon semiconductor layer and electrically connects the first conductor region LTPSCO and the second conductor region IGZOCO of the oxide semiconductor layer is provided in the first gate insulating film GI1 and the first interlayer insulating film ILD1.

A second contact hole CH2 illustrated in FIG. 5 is a contact hole that electrically connects an upper layer connection wiring line H4-C formed of the fourth metal layer (upper metal layer) H4 and the second conductor region IGZOCO, a third contact hole CH3 illustrated in FIG. 5 and FIG. 6 is a contact hole that electrically connects first conductor connection wiring lines H4-B, H4-D formed of the fourth metal layer (upper metal layer) H4 and the first conductor region LTPSCO, a fourth contact hole CH4 illustrated in (a) of FIG. 4 is a contact hole that electrically connects a first gate connection wiring line H4-F formed of the fourth metal layer (upper metal layer) H4 and the first gate electrode GE formed of the first metal layer H1, and a fifth contact hole CH5 illustrated in (a) of FIG. 4, (b) of FIG. 4 and FIG. 5 is a contact hole that electrically connects an electrode connection wiring line H4-A formed of the fourth metal layer (upper metal layer) H4 and a counter electrode H2-C formed of the second metal layer (lower metal layer) H2.

As illustrated in FIG. 4 to FIG. 6, the second metal layer (lower metal layer) H2 includes a second conductor connection wiring line H2-B in contact with the second conductor region IGZOCO, and a lower layer connection wiring line H2-A electrically connected to the second conductor region IGZOCO and the first conductor region LTPSCO. The fourth metal layer (upper metal layer) H4 includes the electrode connection wiring line H4-A, the first conductor connection wiring lines H4-B, H4-D, the upper layer connection wiring line H4-C, and the first gate connection wiring line H4-F.

As illustrated in FIG. 5, a protection layer GI2' having an island shape is provided between the second conductor region IGZOCO and the second interlayer insulating film ILD2. Furthermore, the second contact hole CH2 that exposes the second conductor connection wiring line H2-B is provided in the protection layer GI2' and the second interlayer insulating film ILD2, the upper layer connection wiring line H4-C is in contact with the second conductor connection wiring line H2-B in the second contact hole CH2, and the second conductor region IGZOCO and the upper layer connection wiring line H4-C are electrically connected to each other via the second conductor connection wiring line H2-B. Note that in the present embodiment, molybdenum (Mo) was used for the second metal layer (lower metal layer) H2 including the second conductor connection wiring line H2-B.

Furthermore, the first conductor connection wiring line H4-D illustrated in FIG. 5 and FIG. 6 is a part of the high power supply voltage line ELVDD, and the wiring line H4-E formed of the fourth metal layer (upper metal layer) H4 illustrated in FIG. 5 is a part of the second initialization power source line Ini.

For example, hydrofluoric acid (HF) treatment is performed in order to remove a surface oxide film of the first conductor region LTPSCO of the crystalline silicon semiconductor layer of a base portion of each of the first contact hole CH1 illustrated in FIG. 5 and FIG. 6, the third contact hole CH3 illustrated in FIG. 5 and FIG. 6, and the fourth contact hole CH4 illustrated in FIG. 4. During this hydrofluoric acid (HF) treatment, an edge of the second contact hole CH2 illustrated in FIG. 5 is likely to be formed into an undercut shape (reverse tapered shape). This is because during the HF treatment of the surface oxide film of the first conductor region LTPSCO of the crystalline silicon semiconductor layer of the base portion of each of the first contact hole CH1, the third contact hole CH3, and the fourth contact hole CH4, the second conductor region IGZOCO pf the oxide semiconductor layer is etched in the second contact hole CH2, the edge of the second contact hole CH2 is shifted by the gap S3 and the gap S4 illustrated in FIG. 5, HF (hydrofluoric acid) permeates from the shifted region to damage a film on the shifted region, whereby a portion of the film on the shifted region is deleted.

In the present embodiment, the protection layer GI2' having an island shape is provided between the second conductor region IGZOCO and the second interlayer insulating film ILD2, and the second contact hole CH2 that exposes the second conductor connection wiring line H2-B is provided in the protection layer GI2' and the second interlayer insulating film ILD2. That is, the protection layer GI2' is provided as the film on the shifted region. When silicon oxide ($SiO_2$) having a higher hydrofluoric acid (HF) resistance than that of silicon nitride (SiNx) (i.e., during the hydrofluoric acid treatment, silicon nitride (SiNx) has a greater etching rate than that of silicon oxide) is used as the protection layer GI2', formation of an undercut shape (reverse tapered shape) in the protection layer GI2' can be suppressed, so that it is possible to suppress occurrence of step disconnection in the upper layer connection wiring line H4-C formed in the second contact hole CH2. As described above, increase in contact resistance and enlargement of the contact area can be suppressed in the second contact hole CH2.

In the present embodiment, description is given using, as an example, a case in which the protection layer GI2' and the second gate insulating film GI2 are formed of a silicon oxide film that is the same material in one step, but this is not a limitation, and for example, even in a case in which the protection layer GI2' and the second gate insulating film GI2 are formed of a silicon oxide film that is the same material, a step of forming the protection layer GI2' and a step of forming the second gate insulating film GI2 may be separate steps rather than a single step.

As illustrated in FIG. 5, as to the second contact hole CH2, an opening including the gap S3 and the gap S4 is provided in the second conductor region IGZOCO so as to overlap with the second contact hole CH2, and the opening including the gap S3 and the gap S4 is larger than the second contact hole CH2 in a plan view. In the present embodiment, description is given using, as an example, a case in which the opening provided in the second conductor region IGZOCO is larger than the second contact hole CH2 in a plan view, but this is not a limitation, and as long as the opening provided in the second conductor region IGZOCO exposes the second conductor connection wiring line H2-B, the size thereof is not particularly limited and may be the same as the size of the second contact hole CH2, or may be smaller than the size of the second contact hole CH2, for example.

Note that as illustrated in FIG. 4 to FIG. 6, the oxide semiconductor layer including the second conductor region IGZOCO is provided so as to cover an upper surface and a side surface of the lower metal layer (second metal layer H2). Thus, the oxide semiconductor layer including the second conductor region IGZOCO serves as a protection layer when the lower metal layer (second metal layer H2) is etched with an etchant for the oxide semiconductor layer.

In the present embodiment, an oxide semiconductor (InGaZnO) including indium (In), gallium (Ga), zinc (Zn), and oxygen was used as the oxide semiconductor layer, but this is not a limitation, and ITZO may be used.

In addition, in the present embodiment, as an etchant (chemical solution) for the oxide semiconductor (InGaZnO) including indium (In), gallium (Ga), zinc (Zn) and oxygen, and for molybdenum (Mo) which is the lower metal layer (second metal layer H2), a mixed solution of phosphoric acid, acetic acid, and nitric acid (also called PAN etchant) were used. The oxide semiconductor (InGaZnO) including indium (In), gallium (Ga), zinc (Zn), and oxygen and molybdenum (Mo) are dissolved together in the PAN etchant, and thus the oxide semiconductor (InGaZnO) including indium (In), gallium (Ga), zinc (Zn), and oxygen needs to cover molybdenum (Mo).

Note that in the present embodiment, the oxide semiconductor (InGaZnO) including indium (In), gallium (Ga), zinc (Zn), and oxygen having a film thickness of 30 to 40 nm was formed and molybdenum (Mo) having a film thickness of 200 to 300 nm was formed, but this is not a limitation.

The lower metal layer (second metal layer H2) includes the lower layer connection wiring line H2-A, and as illustrated in FIG. 5 and FIG. 6, in the first contact hole CH1, the lower layer connection wiring line H2-A is in contact with the first conductor region LTPSCO, and the first conductor region LTPSCO and the second conductor region IGZOCO are electrically connected to each other via the lower layer connection wiring line H2-A.

Furthermore, as illustrated in FIG. 5 and FIG. 6, the lower layer connection wiring line H2-A is provided in an island shape such that the upper surface and the side surface thereof are covered by the second conductor region IGZOCO.

The upper metal layer (fourth metal layer H4) includes the first conductor connection wiring lines H4-B, H4-D in contact with the first conductor region LTPSCO, and as illustrated in FIG. 5 and FIG. 6, the third contact hole CH3 that exposes the first conductor region LTPSCO and electrically connects the first conductor region LTPSCO and the first conductor connection wiring lines H4-B, H4-D is provided in the first gate insulating film GI1, the first interlayer insulating film ILD1, and the second interlayer insulating film ILD2. In the third contact hole CH3, the first conductor connection wiring lines H4-B, H4-D are in contact with the first conductor region LTPSCO. Note that the first conductor connection wiring line H4-B illustrated in FIG. 5 is a part of the data signal line data(m).

The upper metal layer (fourth metal layer H4) includes the first gate connection wiring line H4-F, and in the drive transistor T4 illustrated in (a) of FIG. 4, the fourth contact hole CH4 that exposes the first gate electrode GE and electrically connects the first gate electrode GE and the first gate connection wiring line H4-F is provided in the first interlayer insulating film ILD1 and the second interlayer insulating film ILD2. In the fourth contact hole CH4, the first gate connection wiring line H4-F is in contact with the first gate electrode GE.

Furthermore, as illustrated in FIG. 5, the lower metal layer (second metal layer H2) includes the counter electrode H2-C, and the upper metal layer (fourth metal layer H4) includes the electrode connection wiring line H4-A. The protection layer GI2' having an island shape is provided between the second conductor region IGZOCO and the second interlayer insulating film ILD2, and the fifth contact hole CH5 that exposes the counter electrode H2-C and electrically connects the counter electrode H2-C and the electrode connection wiring line H4-A is provided in the second conductor region IGZOCO, the protection layer GI2', and the second interlayer insulating film ILD2. In the fifth contact hole CH5, the counter electrode H2-C and the electrode connection wiring line H4-A are in contact with each other. In the fifth contact hole CH5 as well, similarly to the second contact hole CH2, formation of an undercut shape (reverse tapered shape) in the protection layer GI2' can be suppressed, and occurrence of step disconnection in the electrode connection wiring line H4-A formed in the fifth contact hole CH5 can be suppressed. As described above, increase in contact resistance and enlargement of the contact area can be suppressed in the fifth contact hole CH5. In the present embodiment, description is given using, as an example, a case in which the opening including a gap 51 and a gap S2 formed in the second conductor region IGZOCO included in the fifth contact hole CH5 is larger than the opening formed in the protection layer GI2' and the opening formed in the second interlayer insulating film ILD2 included in the fifth contact hole CH5 in a plan view, but this is not a limitation, and as long as the opening provided in the second conductor region IGZOCO exposes the counter electrode H2-C, the size of the opening is not particularly limited and, for example, may be equal to or smaller than the sizes of the opening formed in the protection layer GI2' and the opening formed in the second interlayer insulating film ILD2 included in the fifth contact hole CH5.

Note that as illustrated in FIG. 5, the first gate electrode GE and the counter electrode H2-C overlap with each other with the first interlayer insulating film ILD1 interposed therebetween to form the capacitance element Cp (see (b) of FIG. 1).

As illustrated in FIG. 5, in the threshold control transistor T2, the second conductor region IGZOCO corresponding to the first contact hole CH1 and the second conductor region IGZOCO corresponding to the second contact hole CH2 are different conductor regions that sandwich the same second channel region IGZOCH.

In addition, as illustrated in FIG. 6, in the power supply transistor T5, the first conductor region LTPSCO corresponding to the first contact hole CH1 and the first conductor region LTPSCO corresponding to the third contact hole CH3 are different conductor regions that sandwich the same first channel region LTPSCH.

Figure 7:
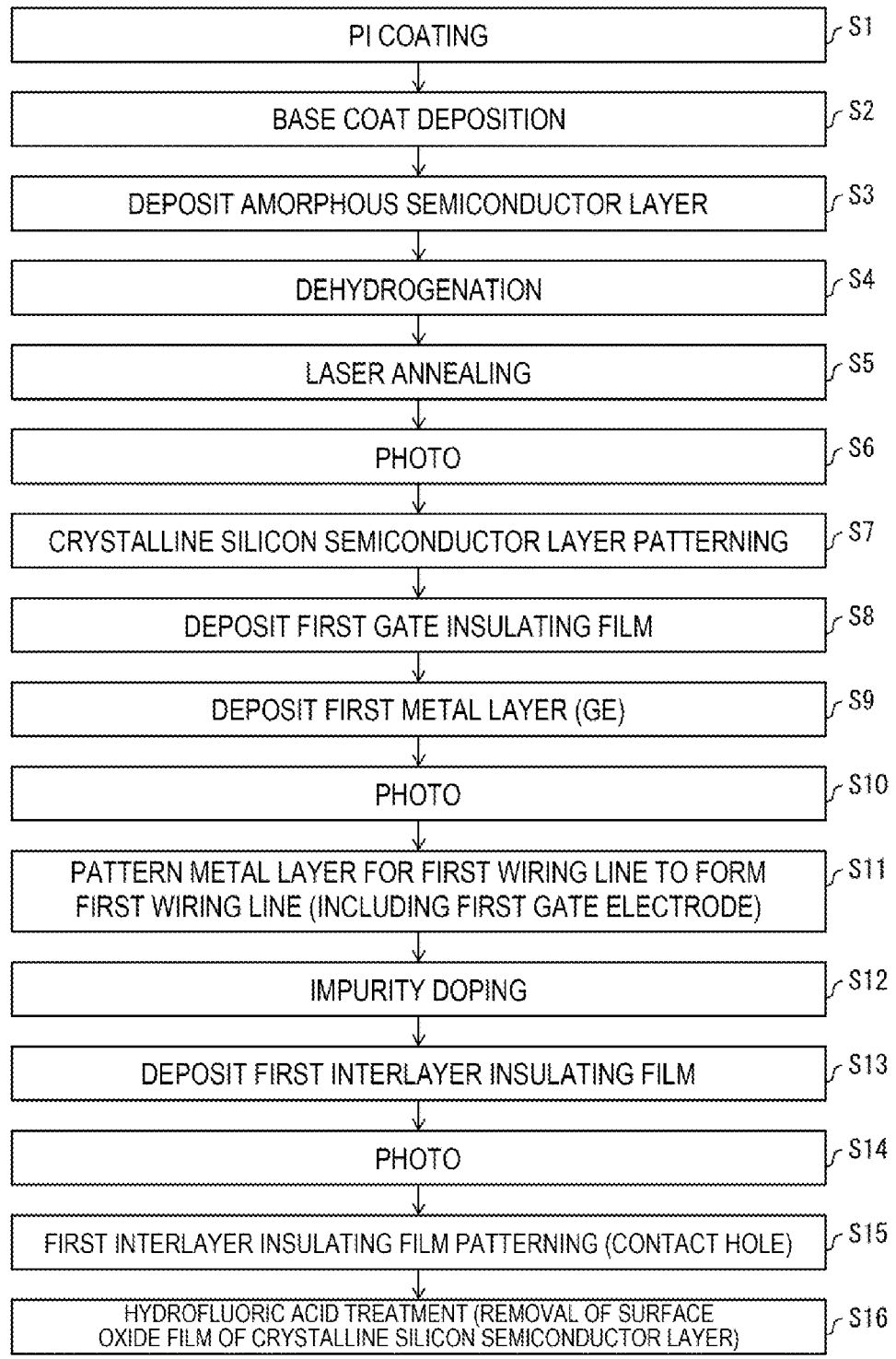
FIG. 7 is a flowchart illustrating a part of a method for manufacturing the display device of the present embodiment.
Figure 8:
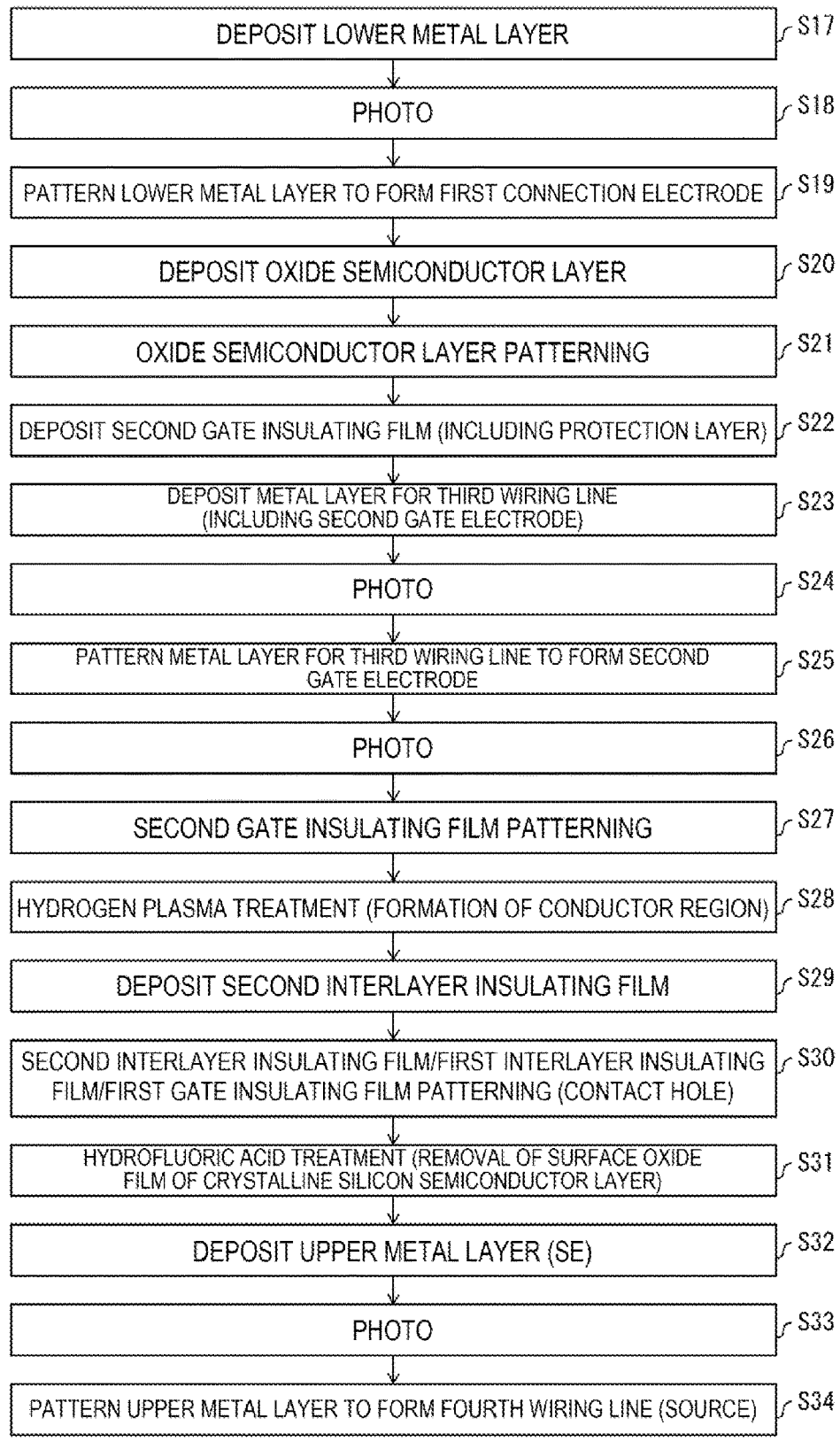
FIG. 8 is a flowchart illustrating a remaining part of the method for manufacturing the display device of the present embodiment.

FIG. 7 is a flowchart illustrating a part of a method for manufacturing the display device 1 according to the present embodiment, and FIG. 8 is a flowchart illustrating a remaining part of the method for manufacturing the display device 1 according to the present embodiment.

A PI coating step (51) illustrated in FIG. 7 is a step of forming the substrate 12 illustrated in FIG. 2, and a base coat film deposition step (S2) is a step of forming the barrier layer (base coat layer) BC illustrated in FIG. 2. A step of depositing an amorphous semiconductor layer (S3), a dehydrogenation step (S4), and a laser annealing step (S5) are steps of forming the crystalline silicon semiconductor layer including the first channel region LTPSCH illustrated in FIG. 2. A photo step (S6) is a step of forming a first resist film in a predetermined shape on the crystalline silicon semiconductor layer, and a crystalline silicon semiconductor layer patterning step (S7) is a step of patterning the crystalline silicon semiconductor layer using the first resist film. A step of depositing a first gate insulating film (S8) is a step of depositing the first gate insulating film GI1, and a step of depositing a first metal layer (GE) (S9) is a step of depositing the first metal layer H1, and a photo step (S10) is a step of forming a second resist film in a predetermined shape on the first metal layer H1. A step of patterning a metal layer for a first wiring line to form a first wiring line (including the first gate electrode) (S11) is a step of patterning the first metal layer H1 using the second resist film. An impurity doping step (S12) is a step of doping impurities using the first gate electrode GE as a mask to form the first conductor region LTPSCO of the crystalline silicon semiconductor layer in a region not overlapping with the first gate electrode GE, in addition to the first channel region LTPSCH of the crystalline silicon semiconductor layer already formed under the first gate electrode GE. A step of depositing a first interlayer insulating film (S13) is a step of depositing the first interlayer insulating film ILD1 illustrated in FIG. 2, a photo step (S14) is a step of forming a third resist film in a predetermined shape on the first interlayer insulating film ILD1, and a first interlayer insulating film patterning (contact hole) step (S15) is a step of patterning the first interlayer insulating film ILD1 and the first gate insulating film GI1 using the third resist film, in which the first contact hole CH1 is formed. For the third contact hole CH3, the first interlayer insulating film ILD1 and the first gate insulating film GI1 may be patterned, and for the fourth contact hole CH4, the first interlayer insulating film ILD1 may be patterned in this step. A hydrofluoric acid treatment (removal of the surface oxide film of the crystalline silicon semiconductor layer)

step (S16) is a step of removing the surface oxide film of the crystalline silicon semiconductor layer by hydrofluoric acid treatment.

A step of depositing a lower metal layer illustrated in FIG. 8 (S17) is a step of depositing the lower metal layer (second metal layer H2), a photo step (S18) is a step of forming a fourth resist film in a predetermined shape on the lower metal layer (second metal layer H2), and a step of patterning a lower metal layer to form a first connection electrode (S19) is a step of patterning the lower metal layer (second metal layer H2) using the fourth resist film. A step of depositing an oxide semiconductor layer (S20) is a step of depositing the oxide semiconductor layer, and a step of patterning an oxide semiconductor layer (S21) is a step of patterning the oxide semiconductor layer into a predetermined shape using a fifth resist film formed into a predetermined shape. A step of depositing a second gate insulating film (including a protection layer) (S22) is a step of depositing a silicon oxide film. A step of depositing a metal layer for a third wiring line (including a second gate electrode) (S23) is a step of forming the third metal layer H3, a photo step (S24) is a step of forming a sixth resist film in a predetermined shape on the third metal layer H3, and a step of patterning the metal layer for the third wiring line to form the second gate electrode (S25) is a step of patterning the third metal layer H3 using the sixth resist film to form the second gate electrode GE' and the like. A photo step (S26) is a step of forming a seventh resist film in a predetermined shape on the silicon oxide film, and a step of patterning the second gate insulating film (S27) is a step of patterning the silicon oxide film using the seventh resist film to form the second gate insulating film GI2 and the protection layer GI2'. In the step of S27, the second contact hole CH2 and the fifth contact hole CH5 of the protection layer GI2' may be formed.

A hydrogen plasma treatment (conductor region forming) step (S28) is a step of forming the second conductor region IGZOCO of the oxide semiconductor layer by performing hydrogen plasma treatment, and a step of depositing a second interlayer insulating film (S29) is a step of depositing the second interlayer insulating film ILD2. In a step of patterning the second interlayer insulating film/first interlayer insulating film/first gate insulating film (contact hole) (S30), the second interlayer insulating film/first interlayer insulating film/first gate insulating film are further patterned. In the step of S30, the second contact hole CH2, the third contact hole CH3, the fourth contact hole CH4, and the fifth contact hole CH5 are formed. In a case where in the step of S15 described above, the first interlayer insulating film ILD1 and the first gate insulating film GI1 of the third contact hole CH3 and the first interlayer insulating film ILD1 of the fourth contact hole CH4 are patterned, only the second interlayer insulating film ILD2 need be patterned for the third contact hole CH3 and the fourth contact hole CH4. Note that, in the step of S30, the third contact hole CH3 and the fourth contact hole CH4 may be formed collectively. In addition, when the contact hole is not formed in the protection layer GI2' in the step of S27 described above, the protection layer GI2' is patterned to form a contact hole in the step of S30. In a hydrofluoric acid treatment (removal of the surface oxide film of the crystalline silicon semiconductor layer) step (S31), the surface oxide film of the crystalline silicon semiconductor layer is removed by hydrofluoric acid treatment. In a step of depositing an upper metal layer (SE) (S32), the fourth metal layer (upper metal layer) H4 is deposited. A photo step (S33) is a step of forming an eighth resist film in a predetermined shape on the fourth metal layer (upper metal layer) H4, and a step of patterning the upper metal layer to form a fourth wiring line (source) (S34) is a step of patterning the fourth metal layer (upper metal layer) H4 using the eighth resist film. Note that the first resist film to the eighth resist film are removed after being used for patterning.

As described above, in the present embodiment, a total of two times of HF cleaning is performed: HF cleaning after formation of the first contact hole CH1 illustrated in FIG. 5 and FIG. 6 (S15) and before deposition of the lower metal layer (second metal layer H2) including the lower layer connection wiring line H2-A, the second conductor connection wiring line H2-B, and the counter electrode H2-C illustrated in FIG. 4 to FIG. 6, and HF cleaning after formation of the third contact hole CH3 illustrated in FIG. 5 and FIG. 6 and before deposition of the upper metal layer (the fourth metal layer H4) including the electrode connection wiring line H4-A, the first conductor connection wiring line H4-B, the upper layer connection wiring line H4-C, the first conductor connection wiring line H4-D, the wiring line H4-E, and the first gate connection wiring line H4-F.

Figure 9:
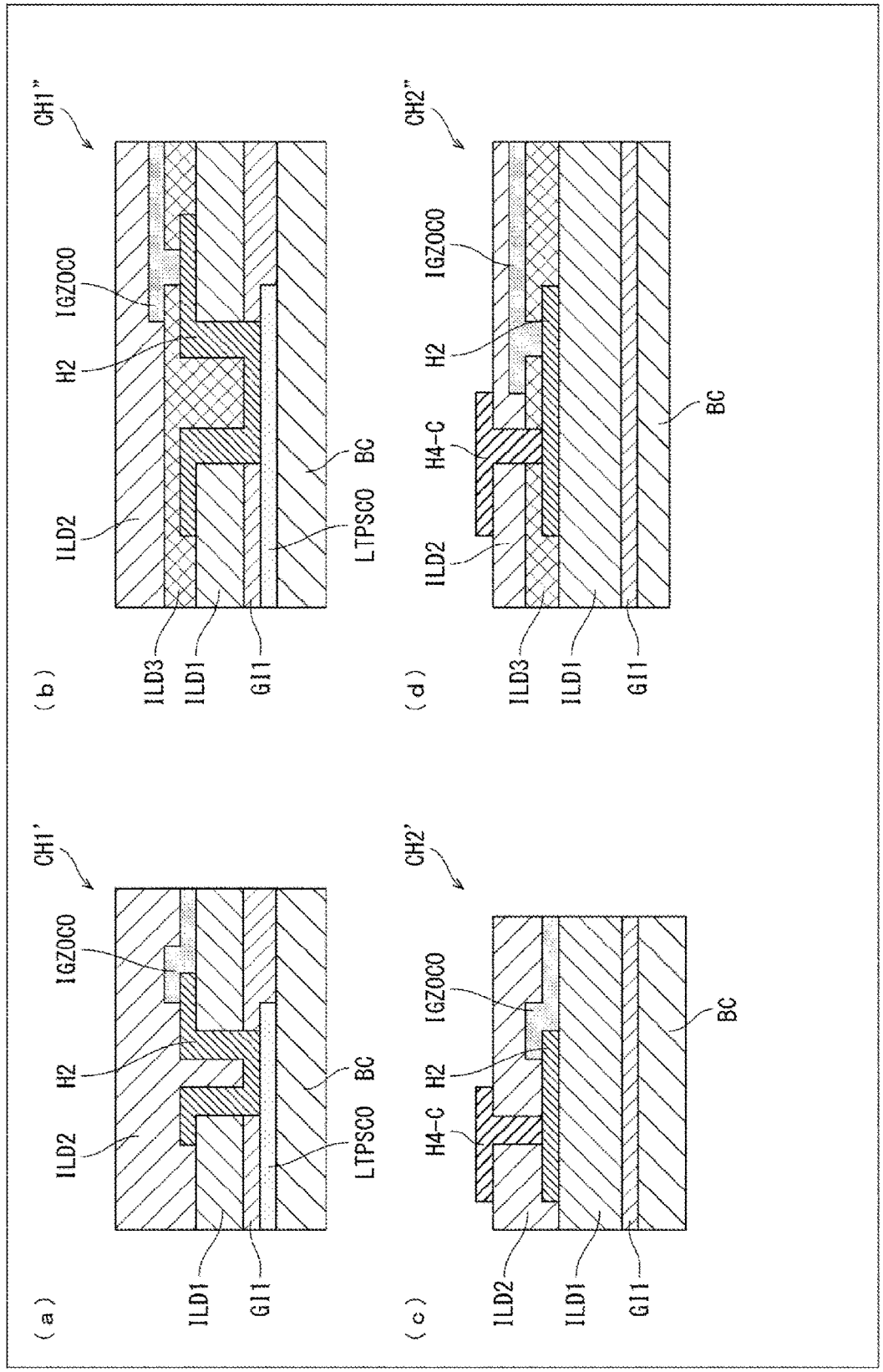
FIG. 9 is a cross-sectional view illustrating a modified example of a contact hole of the present embodiment.

MODIFIED EXAMPLE (a) of FIG. 9 and (b) of FIG. 9 are cross-sectional views illustrating modified examples of the first contact hole CH1, and (c) of FIG. 9 and (d) of FIG. 9 are cross-sectional views illustrating modified examples of the second contact hole CH2.

A first contact hole CH1' illustrated in (a) of FIG. 9 can be used in a case where the lower metal layer (second metal layer H2) is not etched by the etchant for the oxide semiconductor (InGaZnO). Thus, the lower metal layer (second metal layer H2) has a portion exposed from the oxide semiconductor (InGaZnO).

In a first contact hole CH1" illustrated in (b) of FIG. 9, a third interlayer insulating film ILD3 is provided between the lower metal layer (second metal layer H2) and the oxide semiconductor layer including the second conductor region IGZOCO.

A second contact hole CH2' illustrated in (c) of FIG. 9 differs from the second contact hole CH2 illustrated in FIG. 5 in that the second contact hole CH2' is formed only in the second interlayer insulating film ILD2.

A second contact hole CH2" illustrated in (d) of FIG. 9 differs from the second contact hole CH2 illustrated in FIG. 5 in that a third interlayer insulating film ILD3 is provided between the first interlayer insulating film ILD1 and the second interlayer insulating film ILD2, and the second contact hole CH2" is formed only in the second interlayer insulating film ILD2 and the third interlayer insulating film ILD3.

Figure 10:
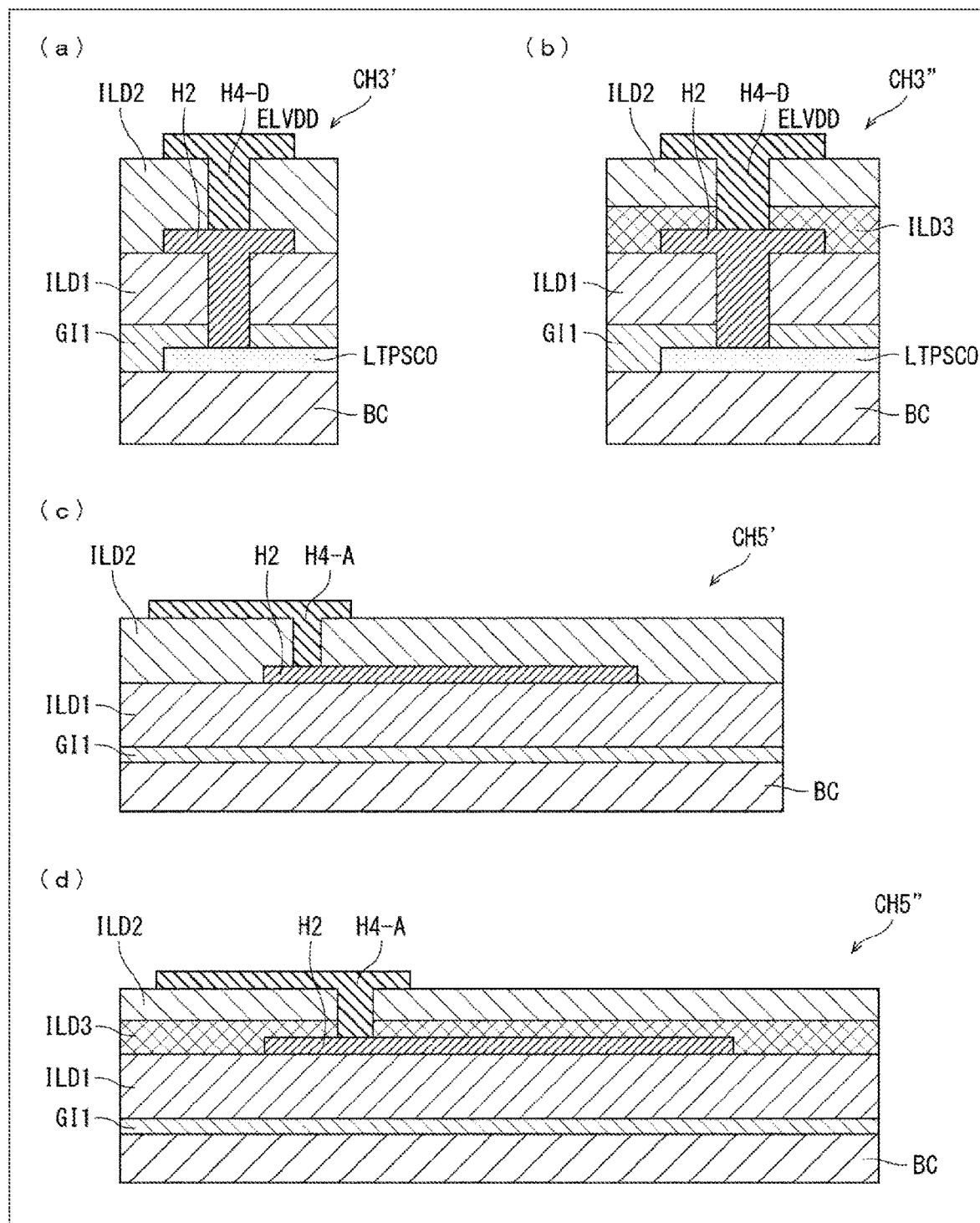
FIG. 10 is a cross-sectional view illustrating another modified example of the contact hole of the present embodiment.
Figure 11:
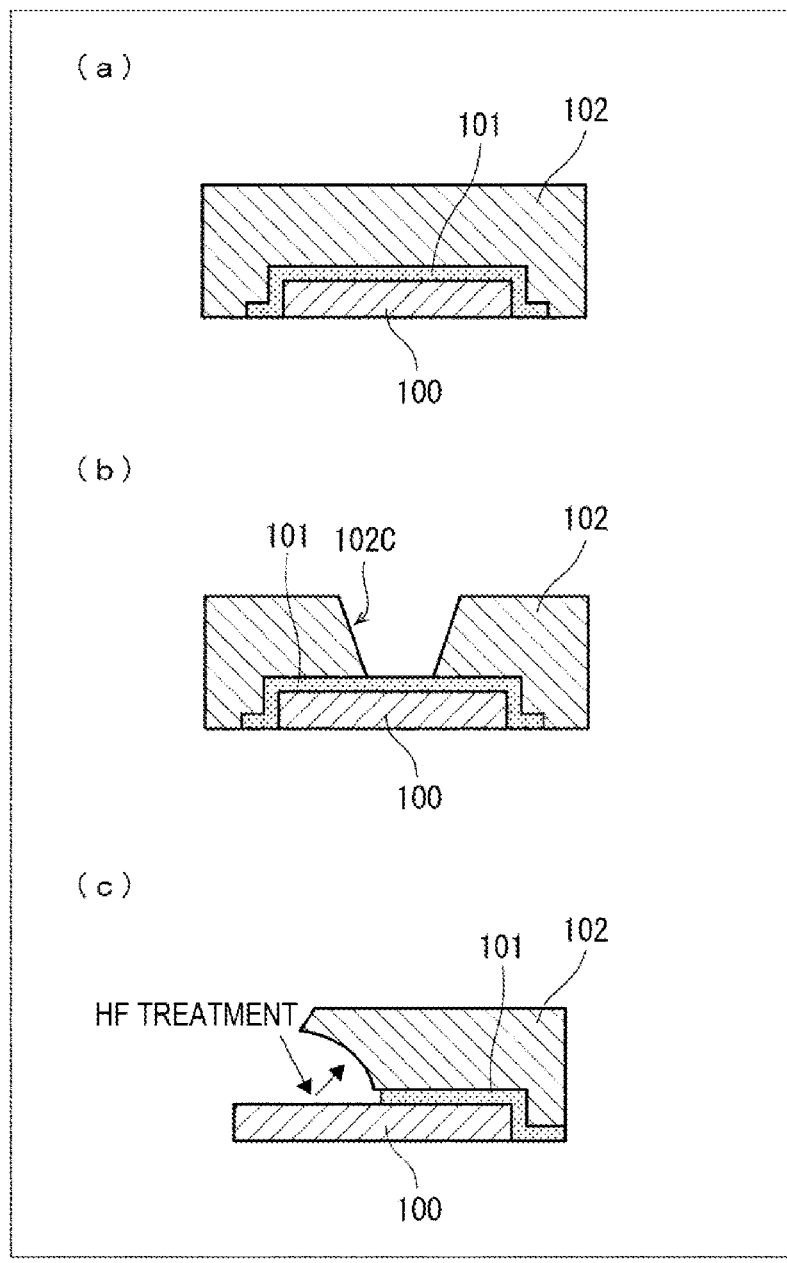
FIGS. 11(a) to 11(c) are diagrams for explaining a problem of damage due to HF in a second contact hole in a known substrate having a hybrid structure.

(a) of FIG. 10 and (b) of FIG. 10 are cross-sectional views illustrating modified examples of the third contact hole CH3, and (c) of FIG. 10 and (d) of FIG. 10 are cross-sectional views illustrating modified examples of the fifth contact hole CH5.

A third contact hole CH3' illustrated in (a) of FIG. 10 differs from the third contact hole CH3 illustrated in FIG. 5 in that the lower metal layer (second metal layer H2) and the upper metal layer (fourth metal layer H4) are formed in the third contact hole CH3'.

A third contact hole CH3" illustrated in (b) of FIG. 10 differs from the third contact hole CH3 illustrated in FIG. 5 in that a third interlayer insulating film ILD3 is provided between the first interlayer insulating film ILD1 and the second interlayer insulating film ILD2, and the lower metal layer (second metal layer H2) and the upper metal layer (fourth metal layer H4) are formed in the third contact hole CH3".

A fifth contact hole CH5' illustrated in (c) of FIG. 10 differs from the fifth contact hole CH5 illustrated in FIG. 5 in that the fifth contact hole CH5' is formed only in the second interlayer insulating film ILD2.

A fifth contact hole CH5" illustrated in (d) of FIG. 10 differs from the fifth contact hole CH5 illustrated in FIG. 5 in that a third interlayer insulating film ILD3 is provided between the first interlayer insulating film ILD1 and the second interlayer insulating film ILD2, and the fifth contact hole CH5" is formed only in the second interlayer insulating film ILD2 and the third interlayer insulating film ILD3.

Supplement

First Aspect

A display device including: a crystalline silicon semiconductor layer; a first gate insulating film; a first gate electrode; a first interlayer insulating film; a lower metal layer; an oxide semiconductor layer; a second gate insulating film; a second gate electrode; a second interlayer insulating film; and an upper metal layer, the crystalline silicon semiconductor layer, the first gate insulating film, the first gate electrode, the first interlayer insulating film, the lower metal layer, the oxide semiconductor layer, the second gate insulating film, the second gate electrode, the second interlayer insulating film, and the upper metal layer being sequentially provided on a substrate,
  wherein the substrate is provided with a first transistor including the crystalline silicon semiconductor layer and a second transistor including the oxide semiconductor layer,
  the crystalline silicon semiconductor layer includes a first channel region and a first conductor region,
  the oxide semiconductor layer includes a second channel region and a second conductor region,
  the second gate insulating film is disposed in alignment with the second gate electrode,
  a first contact hole exposing the first conductor region and electrically connecting the first conductor region and the second conductor region is provided in the first gate insulating film and the first interlayer insulating film,
  the lower metal layer includes a second conductor connection wiring line in contact with the second conductor region,
  the upper metal layer includes an upper layer connection wiring line,
  a protection layer having an island shape is provided between the second conductor region and the second interlayer insulating film,
  a second contact hole exposing the second conductor connection wiring line is provided in the protection layer and the second interlayer insulating film,
  the upper layer connection wiring line is in contact with the second conductor connection wiring line in the second contact hole, and
  the second conductor region and the upper layer connection wiring line are electrically connected to each other via the second conductor connection wiring line.

Second Aspect

The display device according to the first aspect, wherein the protection layer is the same layer as the second gate insulating film, and is formed of the same material as the second gate insulating film.

Third Aspect

The display device according to the first or second aspect, wherein the protection layer is a silicon oxide film, and the second interlayer insulating film is a silicon nitride film.

Fourth Aspect

The display device according to any one of the first to third aspects, wherein the oxide semiconductor layer covers an upper surface and a side surface of the lower metal layer.

Fifth Aspect

The display device according to any one of the first to fourth aspects, wherein a third interlayer insulating film is provided between the lower metal layer and the oxide semiconductor layer.

Sixth Aspect

The display device according to any one of the first to fifth aspects, wherein, in the second contact hole, an opening is provided in the second conductor region so as to overlap the second contact hole, and
  the opening is larger than the second contact hole in a plan view.

Seventh Aspect

The display device according to any one of the first to sixth aspects, wherein the second conductor region covers the upper surface and the side surface of the lower metal layer.

Eighth Aspect

The display device according to any one of the first to seventh aspects, wherein the lower metal layer includes a lower layer connection wiring line, and
  in the first contact hole, the lower layer connection wiring line is in contact with the first conductor region, and the first conductor region and the second conductor region are electrically connected to each other via the lower layer connection wiring line.

Ninth Aspect

The display device according to the eighth aspect, wherein the lower layer connection wiring line is provided in an island shape, the upper surface and the side surface of the lower layer connection wiring line being covered by the second conductor region.

Tenth Aspect

The display device according to any one of the first to ninth aspects, wherein the upper metal layer includes a first conductor connection wiring line in contact with the first conductor region, a third contact hole exposing the first conductor region and electrically connecting the first conductor region and the first conductor connection wiring line is provided in the first gate insulating film, the first interlayer insulating film, and the second interlayer insulating film, and in the third contact hole, the first conductor connection wiring line is in contact with the first conductor region.

Eleventh Aspect

The display device according to any one of the first to tenth aspects, wherein the upper metal layer includes a first gate connection wiring line,
- a fourth contact hole exposing the first gate electrode and electrically connecting the first gate electrode and the first gate connection wiring line is provided in the first interlayer insulating film and the second interlayer insulating film, and
- in the fourth contact hole, the first gate connection wiring line is in contact with the first gate electrode.

Twelfth Aspect

The display device according to any one of the first to eleventh aspects, wherein the lower metal layer includes a counter electrode,
- the upper metal layer includes an electrode connection wiring line,
- a protection layer having an island shape is provided between the second conductor region and the second interlayer insulating film,
- a fifth contact hole exposing the counter electrode and electrically connecting the counter electrode and the electrode connection wiring line is provided in the second conductor region, the protection layer, and the second interlayer insulating film, and
- in the fifth contact hole, the counter electrode and the electrode connection wiring line are in contact with each other.

Thirteenth Aspect

The display device according to any one of the first to twelfth aspects, wherein a second conductor region corresponding to the first contact hole and a second conductor region corresponding to the second contact hole are different conductor regions that sandwich an identical second channel region.

Fourteenth Aspect

The display device according to the tenth aspect, wherein a first conductor region corresponding to the first contact hole and a first conductor region corresponding to the third contact hole are different conductor regions that sandwich an identical first channel region.

Fifteenth Aspect

The display device according to any one of the first to fourteenth aspects, further comprising a pixel circuit,
wherein the pixel circuit includes:
- a drive transistor configured to control current flowing in a light-emitting element;
- a first initialization transistor connected between a first initialization power source line and a control terminal of the drive transistor;
- a threshold control transistor connected between a drain region and the control terminal of the drive transistor;
- a writing control transistor connected between a data signal line and a source region of the drive transistor;
- a power supply transistor connected between a high power supply voltage line and the drain region of the drive transistor;
- a light emission control transistor connected between the source region of the drive transistor and a first electrode of the light-emitting element;
- a second initialization transistor connected between a second initialization power source line and the first electrode of the light-emitting element; and
- a capacitor connected to the control terminal of the drive transistor and configured to hold a data signal in the data signal line.

Sixteenth Aspect

The display device according to the fifteenth aspect, wherein the drive transistor is composed of the first transistor.

Seventeenth Aspect

The display device according to the sixteenth aspect, wherein the lower metal layer includes a counter electrode, and
- the first gate electrode and the counter electrode overlap each other with the first interlayer insulating film interposed between the first gate electrode and the counter electrode to form a capacitance element.

Eighteenth Aspect

The display device according to any one of the fifteenth to seventeenth aspects, wherein at least one of the first initialization transistor, the threshold control transistor, and the second initialization transistor is composed of the second transistor.

Nineteenth Aspect

The display device according to any one of the fifteenth to eighteenth aspects, wherein the threshold control transistor is composed of the second transistor,
- the writing control transistor is composed of the first transistor, and
- a first gate electrode of the writing control transistor and a second gate electrode of the threshold control transistor are scanning signal lines to which a common scanning signal is input.

Twentieth Aspect

The display device according to any one of the fifteenth to nineteenth aspects, wherein the power supply transistor and the light emission control transistor each are composed of the first transistor, and
- first gate electrodes of the power supply transistor and the light emission control transistor are light emission control lines to which a common light emission control signal is input.

Twenty-First Aspect

The display device according to any one of the fifteenth to twentieth aspects, wherein a second initialization transistor in the pixel circuit in question and a second initialization transistor in a pixel circuit in a preceding stage of the pixel circuit in question each are composed of the second transistor, and a second gate electrode of the second initialization transistor in the pixel circuit in question and a second gate electrode of the second initialization transistor in the pixel circuit in the preceding stage of the pixel circuit in question are scanning signal lines to which a common scanning signal is input.

Twenty-Second Aspect

The display device according to any one of the fifteenth to twenty-first aspects, wherein the first initialization power source line and the high power supply voltage line are a common wiring line.

Twenty-Third Aspect

The display device according to any one of the fifteenth to twenty-second aspects, further comprising a low power supply voltage line, wherein a voltage identical to the low power supply voltage line is input to the second initialization power source line.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device.

The invention claimed is:

1. A display device comprising:
a crystalline silicon semiconductor layer;
a first gate insulating film;
a first gate electrode;
a first interlayer insulating film;
a lower metal layer;
an oxide semiconductor layer;
a second gate insulating film;
a second gate electrode;
a second interlayer insulating film; and
an upper metal layer,
the crystalline silicon semiconductor layer, the first gate insulating film, the first gate electrode, the first interlayer insulating film, the lower metal layer, the oxide semiconductor layer, the second gate insulating film, the second gate electrode, the second interlayer insulating film, and the upper metal layer being sequentially provided on a substrate,
wherein the substrate is provided with a first transistor including the crystalline silicon semiconductor layer and a second transistor including the oxide semiconductor layer,
the crystalline silicon semiconductor layer includes a first channel region and a first conductor region,
the oxide semiconductor layer includes a second channel region and a second conductor region,
the second gate insulating film is disposed in alignment with the second gate electrode,
a first contact hole exposing the first conductor region and electrically connecting the first conductor region and the second conductor region is provided in the first gate insulating film and the first interlayer insulating film,
the lower metal layer includes a second conductor connection wiring line in contact with the second conductor region,
the upper metal layer includes an upper layer connection wiring line,
a protection layer having an island shape is provided between the second conductor region and the second interlayer insulating film,
a second contact hole exposing the second conductor connection wiring line is provided in the protection layer and the second interlayer insulating film,
the upper layer connection wiring line is in contact with the second conductor connection wiring line in the second contact hole, and
the second conductor region and the upper layer connection wiring line are electrically connected to each other via the second conductor connection wiring line.

2. The display device according to claim 1, wherein the protection layer is the same layer as the second gate insulating film, and is formed of the same material as the second gate insulating film.

3. The display device according to claim 1, wherein the protection layer is a silicon oxide film, and the second interlayer insulating film is a silicon nitride film.

4. The display device according to claim 1, wherein the oxide semiconductor layer covers an upper surface and a side surface of the lower metal layer.

5. The display device according to claim 1, wherein a third interlayer insulating film is provided between the lower metal layer and the oxide semiconductor layer.

6. The display device according to claim 1, wherein, in the second contact hole, an opening is provided in the second conductor region so as to overlap the second contact hole, and
the opening is larger than the second contact hole in a plan view.

7. The display device according to claim 1, wherein the second conductor region covers the upper surface and the side surface of the lower metal layer.

8. The display device according to claim 1, wherein the lower metal layer includes a lower layer connection wiring line, and
in the first contact hole, the lower layer connection wiring line is in contact with the first conductor region, and the first conductor region and the second conductor region are electrically connected to each other via the lower layer connection wiring line.

9. The display device according to claim 8,
wherein the lower layer connection wiring line is provided in an island shape, the upper surface and the side surface of the lower layer connection wiring line being covered by the second conductor region.

10. The display device according to claim 1,
wherein the upper metal layer includes a first conductor connection wiring line in contact with the first conductor region,
a third contact hole exposing the first conductor region and electrically connecting the first conductor region and the first conductor connection wiring line is provided in the first gate insulating film, the first interlayer insulating film, and the second interlayer insulating film, and
in the third contact hole, the first conductor connection wiring line is in contact with the first conductor region.

11. The display device according to claim 1,
wherein the upper metal layer includes a first gate connection wiring line,
a fourth contact hole exposing the first gate electrode and electrically connecting the first gate electrode and the first gate connection wiring line is provided in the first interlayer insulating film and the second interlayer insulating film, and
in the fourth contact hole, the first gate connection wiring line is in contact with the first gate electrode.

12. The display device according to claim 1,
wherein the lower metal layer includes a counter electrode,
the upper metal layer includes an electrode connection wiring line,
a protection layer having an island shape is provided between the second conductor region and the second interlayer insulating film,
a fifth contact hole exposing the counter electrode and electrically connecting the counter electrode and the electrode connection wiring line is provided in the second conductor region, the protection layer, and the second interlayer insulating film, and
in the fifth contact hole, the counter electrode and the electrode connection wiring line are in contact with each other.

13. The display device according to claim 1,
wherein a second conductor region corresponding to the first contact hole and a second conductor region corresponding to the second contact hole are different conductor regions that sandwich an identical second channel region.

14. The display device according to claim 10,
wherein a first conductor region corresponding to the first contact hole and a first conductor region corresponding to the third contact hole are different conductor regions that sandwich an identical first channel region.

15. The display device according to claim 1, further comprising:
a pixel circuit,
wherein the pixel circuit includes
a drive transistor configured to control current flowing in a light-emitting element,
a first initialization transistor connected between a first initialization power source line and a control terminal of the drive transistor,
a threshold control transistor connected between a drain region and the control terminal of the drive transistor,
a writing control transistor connected between a data signal line and a source region of the drive transistor,
a power supply transistor connected between a high power supply voltage line and the drain region of the drive transistor,
a light emission control transistor connected between the source region of the drive transistor and a first electrode of the light-emitting element,
a second initialization transistor connected between a second initialization power source line and the first electrode of the light-emitting element, and
a capacitor connected to the control terminal of the drive transistor and configured to hold a data signal in the data signal line.

16. The display device according to claim 15,
wherein the drive transistor is composed of the first transistor.

17. The display device according to claim 16,
wherein the lower metal layer includes a counter electrode, and
the first gate electrode and the counter electrode overlap each other with the first interlayer insulating film interposed between the first gate electrode and the counter electrode to form a capacitive element.

18. The display device according to claim 15,
wherein at least one of the first initialization transistor, the threshold control transistor, and the second initialization transistor is composed of the second transistor.

19. The display device according to claim 15,
wherein the threshold control transistor is composed of the second transistor,
the writing control transistor is composed of the first transistor, and
a first gate electrode of the writing control transistor and a second gate electrode of the threshold control transistor are scanning signal lines to which a common scanning signal is input.

20. The display device according to claim 15,
wherein the power supply transistor and the light emission control transistor each are composed of the first transistor, and
first gate electrodes of the power supply transistor and the light emission control transistor are light emission control lines to which a common light emission control signal is input.

* * * * *